United States Patent [19]

Nilssen

[11] Patent Number: 5,438,239
[45] Date of Patent: * Aug. 1, 1995

[54] FLUORESCENT LAMP BALLAST WITH LIGHT OUTPUT CONTROL

[76] Inventor: Ole K. Nilssen, 408 Caesar Dr., Barrington, Ill. 60010

[*] Notice: The portion of the term of this patent subsequent to Oct. 17, 2006 has been disclaimed.

[21] Appl. No.: 137,885

[22] Filed: Oct. 19, 1993

Related U.S. Application Data

[60] Continuation of Ser. No. 440,423, Jan. 30, 1990, abandoned, which is a continuation of Ser. No. 782,016, Sep. 30, 1985, abandoned, which is a continuation-in-part of Ser. No. 262,542, May 11, 1981, Pat. No. 4,677,345, which is a division of Ser. No. 178,107, Aug. 14, 1980, abandoned.

[51] Int. Cl.[6] .................... H05B 41/29; H05B 41/39
[52] U.S. Cl. .................... 315/151; 315/158; 315/209 R
[58] Field of Search ........... 315/134, 150, 151, 156, 315/157, 158, 159, 209 R, 309; 331/113 A; 250/205, 227, 239; 362/221, 222

[56] References Cited

U.S. PATENT DOCUMENTS

| | | | |
|---|---|---|---|
| Re. 28,783 | 4/1976 | Ackermann | 315/151 |
| 3,209,202 | 9/1965 | Dunigan | 315/156 |
| 3,422,310 | 1/1969 | Widmayer | 315/100 |
| 3,541,504 | 11/1970 | Bush . | |
| 3,584,227 | 6/1971 | Matsas | 250/227 |
| 3,621,269 | 11/1971 | Misencik | 250/227 |
| 3,681,654 | 8/1972 | Quinn | 315/151 |
| 3,710,177 | 1/1973 | Ward | 315/DIG. 2 |
| 3,852,777 | 12/1974 | Lieser et al. | 354/459 |
| 4,023,034 | 5/1977 | Schacht | 250/227 |
| 4,033,263 | 7/1977 | Richmond | 101/424.1 |
| 4,060,752 | 11/1977 | Walker | 315/DIG. 5 X |
| 4,184,128 | 1/1980 | Nilssen | 315/DIG. 2 |
| 4,201,934 | 5/1980 | Esaki | 315/151 |
| 4,207,498 | 6/1980 | Spira et al. | 315/DIG. 4 |
| 4,210,846 | 7/1980 | Capewell et al. | 315/DIG. 4 X |
| 4,254,364 | 3/1981 | Flint et al. | 315/311 |
| 4,277,728 | 7/1981 | Stevens | 315/307 |
| 4,346,332 | 8/1982 | Walden | 315/307 |
| 4,370,600 | 1/1983 | Zansky | 315/244 |
| 4,394,603 | 7/1983 | Widmayer | 315/151 |
| 4,414,493 | 11/1983 | Henrich | 315/308 |
| 4,463,284 | 7/1984 | Tamura et al. . | |
| 4,513,364 | 4/1985 | Nilssen | 315/219 X |
| 4,682,084 | 7/1987 | Kuhnel et al. | 315/307 |
| 4,874,989 | 10/1989 | Nilssen | 315/DIG. 5 X |

Primary Examiner—David Mis

[57] ABSTRACT

A power-line-operated inverter-type ballast powers one or more fluorescent lamps in a lighting fixture. The ballast comprises self-oscillating inverter means wherein the frequency of oscillation can be influenced by receipt of a control signal at a pair of control terminals connected in circuit with the inverter's positive feedback circuit. The ballast also comprises optical sensor means so positioned and constituted as to sense the light level within the lighting fixture and to provide a control signal commensurate with that light level. This control signal is then applied to the control terminals in such manner as to regulate the inverter frequency as a function of the light level, thereby correspondingly to regulate the magnitude of the current fed to the fluorescent lamps. By providing a threshold means in combination with high gain in the control loop, the fixture light level may be accurately maintained at any desired value substantially regardless of any changes in magnitude of power line voltage and/or in lamp efficacies. The inverter's positive feedback is attained by way of saturable current transformer means, and control of inverter frequency is attained by providing more or less heat to the saturable magnetic material of the current transformer means, thereby correspondingly to decrease or increase the saturation limits of this magnetic material; which, in turn, correspondingly increases or decreases the frequency of inverter oscillation.

10 Claims, 2 Drawing Sheets

FLUORESCENT LAMP BALLAST WITH LIGHT OUTPUT CONTROL

RELATED APPLICATIONS

This application is a continuation of Ser. No. 07/440,423 filed Jan. 30, 1990, now abandoned; which is a continuation of Ser. No. 06/782,016 filed Sep. 30, 1985, now abandoned; which is a Continuation-in-Part of Ser. No. 06/262,542 filed May, 11, 1981, now U.S. Pat. No. 4,677,345; which is a Division of Ser. No. 06/178,107 filed Aug. 14, 1980.

BACKGROUND OF THE INVENTION

1. Field of Invention

The invention relates to ballasts for gas discharge lamps, particularly of a kind wherein the light output can be controllably maintained at any desired level.

2. Prior Art and General Background

It is well known that significant improvements in overall cost-effectivity can result from appropriately controlling the level of light output from lighting fixtures used for general lighting of offices and the like.

Fluorescent lamp ballasting systems adapted to permit control of light output level on a systems basis presently do exist—as for instance in accordance with U.S. Pat. No. 4,207,498 to Spira et al. However, there are significant complexities associated with practical applications of such light level control systems; and, in spite of the very significant improvements potentially available in cost-effectivity, such light control systems have not gained wide acceptance.

Much of the value available from a light control system may be attained by control of each individual lighting fixture. That way, for instance, light output from each fixture could be kept constant irrespective of any variations in the magnitude of the power line voltage and/or regardless of changes in luminous efficacy of the fluorescent lamp(s) used in the fixture.

SUMMARY OF THE INVENTION

OBJECTS OF THE INVENTION

One object of the present invention is that of providing an improved method of controlling the light output level of a gas discharge lamp.

A second object is that of providing a means whereby the light output level of a lighting fixture may be effectively and automatically controlled.

A third object is that of providing a cost-effective way of controllably regulating the output of an inverter-type ballast in such manner as to maintain a substantially constant light output irrespective of any variations in the magnitude of the power line voltage and/or regardless of any changes in the luminous efficacy of the gas discharge lamp.

These as well as other objects, features and advantages of the present invention will become apparent from the following description and claims.

BRIEF DESCRIPTION

In its preferred embodiment, the present invention constitutes a power-line-operated inverter-type ballast that powers one or more fluorescent lamps in a lighting fixture. The ballast comprises self-oscillating inverter wherein the frequency of oscillation can be influenced by receipt of a control signal at a pair of control terminals connected in circuit with the inverter's positive feedback circuit. The ballast also comprises optical sensor means so positioned and constituted as to sense the light level within the lighting fixture and to provide a control signal commensurate with that light level. This control signal is then applied to the control terminals in such manner as to regulate the inverter frequency as a function of the light level, thereby correspondingly to regulate the magnitude of the current fed to the fluorescent lamps. By providing a threshold means in combination with high gain in the control loop, the fixture light level may be accurately maintained at any desired value substantially regardless of any changes in magnitude of power line voltage and/or in lamp efficacies.

The inverter's positive feedback is attained by way of saturable current transformer means, and control of inverter frequency is attained by providing more or less heat to the saturable magnetic material of the current transformer means, thereby correspondingly to decrease or increase the saturation limits of this magnetic material; which, in turn, correspondingly increases or decreases the frequency of inverter oscillation.

The inverter provides its high frequency output to an L-C series-combination and the fluorescent lamp is connected in parallel circuit with the capacitor of this L-C combination.

DESCRIPTION OF THE PREFERRED EMBODIMENT

DESCRIPTION OF THE DRAWINGS

Figure 1:
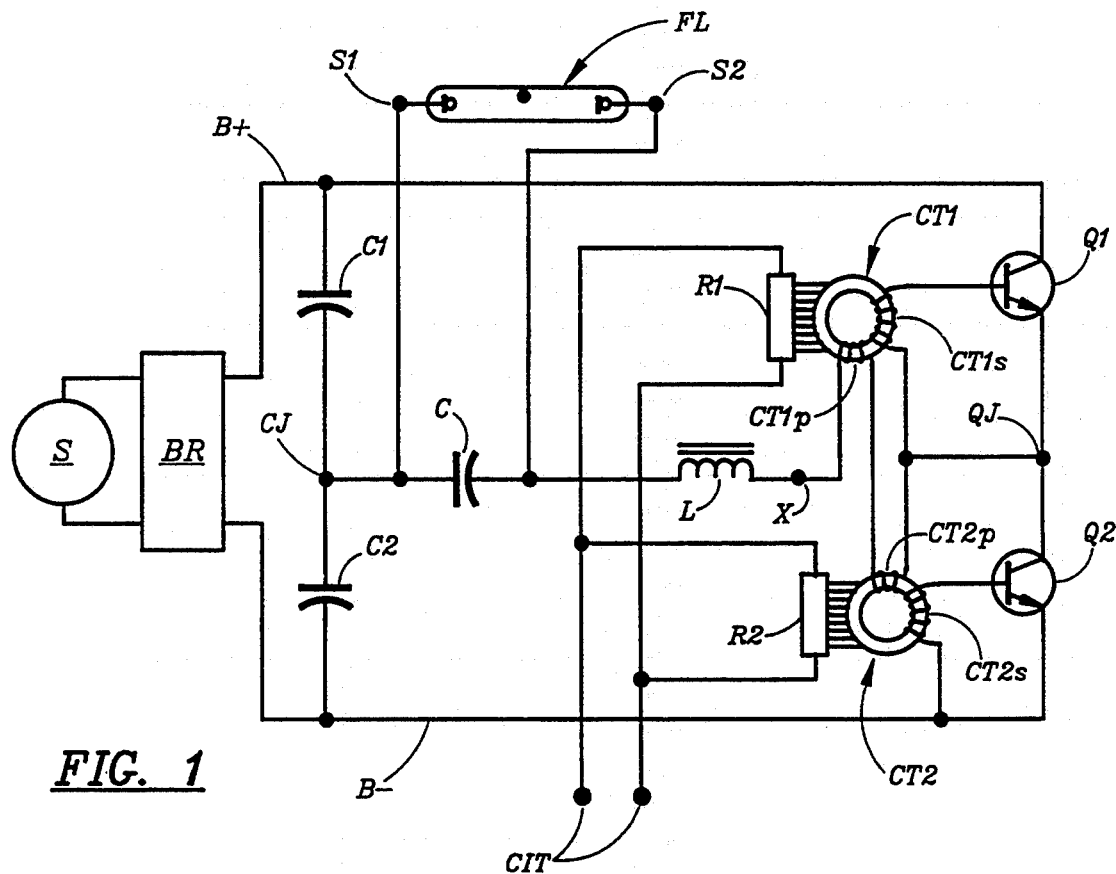
FIG. 1 diagrammatically illustrates a power-line-operated self-oscillating inverter-type ballast with saturable transformer means in its positive feedback path and with electrical input means for affecting control of the inversion frequency.

In FIG. 1, a source S of 120 Volt/60 Hz voltage is applied to a full-wave bridge rectifier BR, the unidirectional voltage output of which is applied directly between a B+ bus and a B− bus, with the positive voltage being connected to the B+ bus.

Between the B+ bus and the B− bus are connected a series-combination of two transistors Q1 and Q2 as well as a series-combination of two energy-storing capacitors C1 and C2.

The secondary winding CT1s of positive feedback current transformer CT1 is connected directly between the base and the emitter of transistor Q1; and the secondary winding CT2s of positive feedback current transformer CT2 is connected directly between the base and the emitter of transistor Q2.

The collector of transistor Q1 is connected directly with the B+ bus; the emitter of transistor Q2 is connected directly with the B− bus; and the emitter of transistor Q1 is connected directly with the collector of transistor Q2, thereby forming junction QJ.

One terminal of capacitor C1 is connected directly with the B+ bus, while the other terminal of capacitor C1 is connected with a junction CJ. One terminal of capacitor C2 is connected directly with the B− bus, while the other terminal of capacitor C2 is connected directly with junction CJ.

An inductor L and a capacitor C are connected in series with one another and with the primary windings CT1p and CT2p of transformers CT1 and CT2.

The series-connected primary windings CT1p and CT2p are connected directly between junction QJ and a point X. Inductor L is connected with one of its terminals to point X and with the other of its terminals to one of the terminals of capacitor C. The other terminal of capacitor C is connected directly with junction CJ.

A fluorescent lamp FL is connected, by way of lamp sockets S1 and S2, in parallel circuit across capacitor C.

Respectively, the two current transformers CT1 and CT2 are thermally connected with heating resistors R1 and R2; which two resistors are parallel-connected across control input terminals CIT.

Values and designations of the various parts of the circuit of FIG. 1 are listed as follows:
  Output of Source S: 120 Volt/60 Hz;
  Bridge rectifier BR: a bridge of four 1N4004's;
  Capacitors C1 & C2: 100 uF/100 Volt Electrolytics;
  Transistors Q1 & Q2: Motorola MJE13002's;
  Capacitor C: 15 nF/1000 Volt(High-Q);
  Inductor L: 130 turns of three twisted strands of #30 wire on a 3019P-L00-3C8 Ferroxcube Ferrite Pot Core with a 120 mil air gap;
  Transformers CT1 & CT2: Wound on Ferroxcube Toroids 213T050 of 3E2A Ferrite Material with three turns of #26 wire for the primary windings and ten turns of #30 wire for the secondary windings;
  Fluorescent Lamp FL: Sylvania Octron F032/31K;
  Resistors R1 & R2: 0.2 kOhm/1 Watt Wirewound's.

The frequency of inverter oscillation associated with the component values identified above—with no power supplied to resistors R1 and R2—is approximately 33 kHz.

Figure 2:
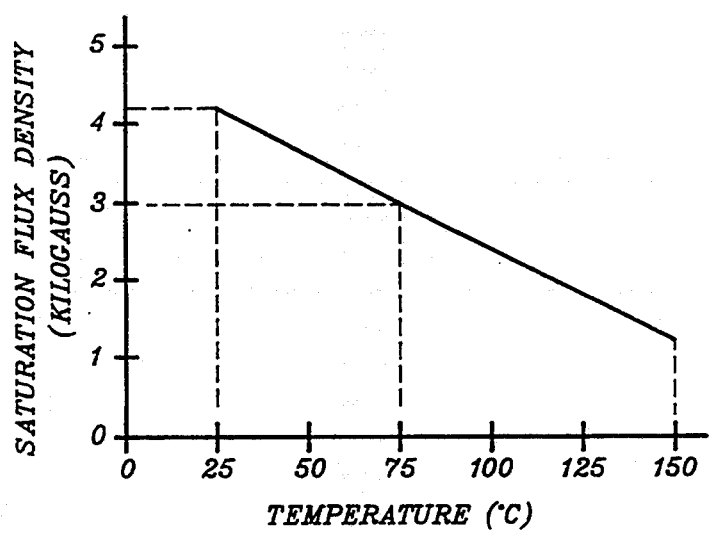
FIG. 2 illustrates the effect of temperature on the saturation characteristics of the magnetic material used in the saturable transformer means.

FIG. 2 shows the relationship between temperature and saturation flux density of the Ferroxcube 3E2A ferrite material used in feedback current transformers CT1 and CT2.

Figure 3:
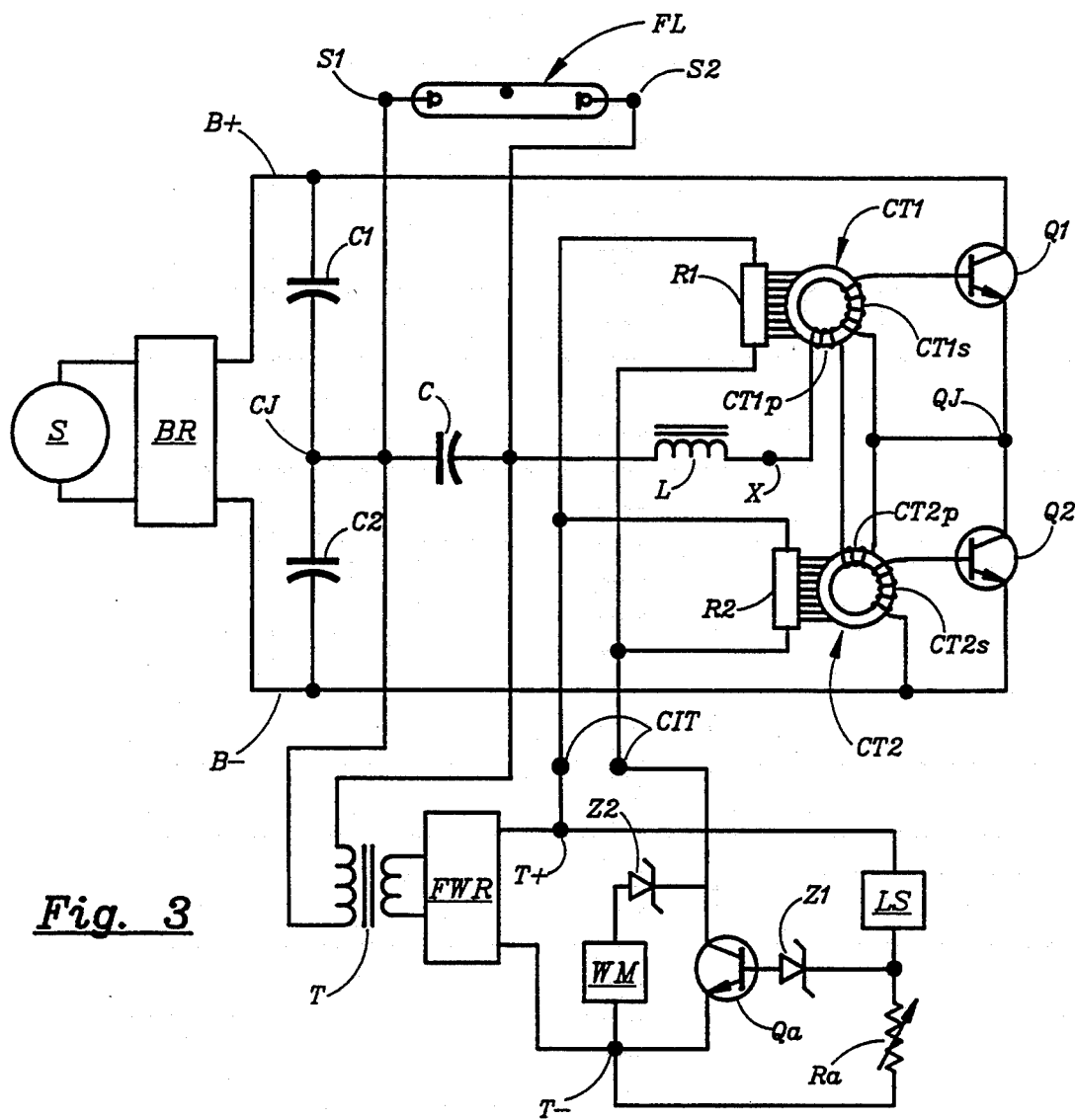
FIG. 3 illustrates the preferred embodiment of the present invention, showing the inverter-type ballast of FIG. 1 combined with optical sensor means and control feedback means operable to keep constant the light output from a fluorescent lamp.

FIG. 3 shows the inverter-type ballast circuit of FIG. 1 arranged such as to provide for automatic control of light output from the fluorescent lamp.

A transformer T is connected with its primary winding across capacitor C; its secondary winding is connected with the AC input terminals of a full-wave rectifier FWR. The positive and negative terminals of the DC output of this rectifier are respectively marked T+ and T−.

A transistor Qa is connected with its collector to the T+ terminal by way of the CIT terminals; and it is connected with its emitter to the T− terminal.

A light sensor LS is connected between the T+ terminal and the cathode of a first Zener diode Z1. The anode of Zener diode Z1 is connected with the base of transistor Qa. An adjustable resistor Ra is connected between the cathode of the Zener diode and the T− terminal.

A second Zener diode Z2 is connected with its cathode to the collector of transistor Qa; and a warning means WM is connected between the anode of Z2 and the T− terminal.

Figure 4:
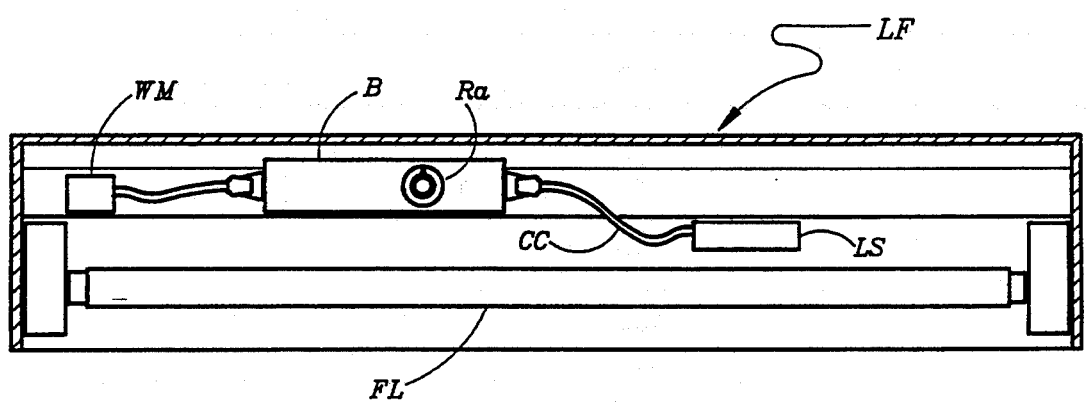
FIG. 4 shows the ballast of FIG. 3 as it is used in an ordinary fluorescent lighting fixture.

FIG. 4 schematically illustrates the use of a ballast B, as made in accordance with the preferred embodiment of FIG. 2, in a lighting fixture LF, which is shown in quasi-cross-section.

The light sensor LS, which is shown as being placed just above the fluorescent lamp FL, is plug-in connected with the ballast B by way of a light-weight connect cord CC. The adjustable resistor Ra is indicated as being accessible from the side of the ballast; and warning means WM is indicated as being mounted on the side of the lighting fixture and plugged into the ballast in manner similar to that of the light sensor.

DESCRIPTION OF OPERATION

The operation of the circuit of FIG. 1 may be explained as follows.

In FIG. 1, the source S represents an ordinary electric utility power line, the voltage from which is applied directly to the bridge rectifier identified as BR. This bridge rectifier is of conventional construction and provides for the rectified line voltage to be applied to the inverter circuit by way of the B+ bus and the B− bus.

The two energy-storing capacitors C1 and C2 are connected directly across the output of the bridge rectifier BR and serve too filter the rectified line voltage, thereby providing for the voltage between the B+ bus and the B− bus to be substantially constant. Junction CJ between the two capacitors serves to provide a power supply center tap.

The inverter circuit of FIG. 1, which represents a so-called half-bridge inverter, operates in a manner that is analogous with circuits previously described in published literature, as for instance in U.S. Pat. No. 4,184,128 to Nilssen entitled High Efficiency Push-Pull Inverters.

The inverter circuit is shown without any means for initiating inverter oscillation. However, once B+ power is applied, oscillation can be initiated simply by momentarily connecting a 50 nF capacitor between the B+ bus and the base of transistor Q2.

Or, as is used in many other inverter circuits, an automatic triggering arrangement consisting of a resistor, capacitor, and a Diac may be used.

At a temperature of 25 Degrees Centigrade, the output of the half-bridge inverter is a substantially squarewave 33 kHz AC voltage. This squarewave voltage is provided between point X and junction CJ. Across this squarewave voltage output is connected a resonant or near-resonant L-C series circuit—with the fluorescent lamp being connected in parallel with the tank-capacitor thereof.

The resonant or near-resonant action of the L-C series circuit provides for appropriate lamp starting and operating voltages, as well as for proper lamp current limiting; which is to say that it provides for appropriate lamp ballasting.

(Resonant or near-resonant ballasting has been described in previous publications, as for instance in U.S. Pat. No. 3,710,177 entitled Fluorescent Lamp Circuit Driven initially at Lower Voltage and Higher Frequency.)

The inverter frequency may be controlled by controlling the temperature of the magnetic cores of the feedback current transformers, as can best be understood by recognizing that—in the inverter circuit of FIG. 1—the ON-time of a given transistor is a direct function of the saturation flux density of the magnetic core in the saturable feedback transformer associated with that, transistor. Thus, other things being equal and in view of the relationship illustrated by FIG. 2, the inversion frequency is a substantially proportional function of the temperature of the ferrite cores used in CT1 and CT2.

However, it should also be understood that the transistor ON-time is a substantially inverse proportional function of the magnitude of the voltage presented to the secondary windings of the saturable feedback current transformers by the base-emitter junctions of the two transistors. That is, other things being equal, the inversion frequency is substantially proportional function of the magnitude of this junction voltage; which is to say, since the magnitude of this junction voltage decreases in approximate proportion to temperature, that the inversion frequency decreases with increasing temperature on the transistors.

When combining the two effects outlined above, and by matching the effects on the inversion frequency due to the temperature effects of ferrite material with those of the counter-working temperature effects of the transistors' base-emitter junction, it is possible substantially to cancel any change in inversion frequency that otherwise might result from temperature changes occurring in a normally operating inverter circuit.

However, aside from any normally occurring changes in the inversion frequency, it is possible in a cost-effective and practical manner to cause substantial additional changes in the inversion frequency. Such changes can controllably be accomplished by way of providing a controllable flow of additional heat to the ferrite cores of the saturable feedback transformers; which is exactly what is accomplished by the two resistors identified as R1 and R2; which two resistors are coupled to the ferrite cores in close thermal relationship.

A given flow of power to the two resistors causes a corresponding proportional temperature rise of the ferrite material. Thus, the inversion frequency will increase from its base value in approximate proportion to the power input to the resistors.

In the circuit of FIG. 1, the purpose of frequency control is that of effecting control of the power output, which is accomplished by way placing a frequency dependent or reactive element in circuit with the load. That way, as the frequency is varied, the flow of power to the load is varied in some corresponding manner.

For extra effective control, this reactive element can be a tuned circuit—as indeed is used in the arrangement of FIG. 1—in which case the degree of power flow control for a given degree of frequency control is enhanced by the frequency selective characteristics of the tuned circuit.

In the particular case of FIG. 1, with no power being provided to resistors R1 and R2, the power supplied to the fluorescent lamp load is approximately 30 Watt. With a power flow of about 1 Watt provided to resistors R1 and R2, the power supplied to the fluorescent lamp load is only about 4 Watt.

Thus, by controlling the amount of power being provided to control input terminals CIT, the light output of fluorescent Lamp FL may be controlled over a wide range.

However, it should be realized that by controlling the light output of fluorescent lamp FL by way of controlling the temperature of the ferrite material in the feedback current transformers, as herein described, the response time can not be instantaneous.

While such delayed response may be annoying in conventional light dimming applications, it is of little significance in several important applications.

In particular, with reference to FIG. 3, the relatively long response time does not constitute a significant detriment in connection with controlling the light output against such effects as: i) changes in the magnitude of the voltage applied to the inverter from source S, ii) variations in the efficacy of the fluorescent lamp, whether these variations be due to lamp manufacturing differences or lamp aging, iii) variations in the ambient temperature to which the fluorescent lamp is subjected, and iv) variations in the ambient temperature to which the ballast itself is subjected.

More particularly, the ballast circuit of FIG. 3 illustrates how the circuit of FIG. 1 is used to provide for automatic control of the light output of the fluorescent lamp.

The light output level is sensed by light sensor LS, which is of such nature that its effective resistance decreases as the light flux received by it increases. Consequently, the voltage developing across adjustable resistor Ra increases with decreasing light output. Depending upon the chosen setting of Ra, with increasing light output, there comes a point at which the magnitude of the voltage across Ra gets to be so high as to cause current to flow through Zener diode Z2 and into the base of transistor Qa; which then causes power to be provided to resistors R1 and R2. In turn, the power provided to these resistors will cause heating of the ferrite cores of feedback transformers CT1 and CT2, thereby reducing the amount of power supplied by the ballast to the fluorescent lamp.

As an overall result, the light output from the lamp will be kept substantially constant at a level determined principally by the threshold provided in the control feedback loop; which threshold is determined by the sum of the voltage drop across the Z1 Zener diode and that of the base-emitter junction of transistor Qa.

Thus, with adequate gain in the total feedback loop (which principally consists of elements LS, Ra, Z1, Qa, R1, R2, CT1, CT2 and the Thermal Coupling Means), the light output will be maintained at a substantially constant level characterized by the point at which the magnitude of the voltage across Ra reaches this threshold—that is, reaches a threshold high enough to cause current to flow through the Z1 Zener diode and into the base of transistor Qa.

If the light output level were to fall below this threshold, current would cease flowing through transistor Qa, and power flow to the ferrite cores will be choked off; thereby causing the cores to cool down and, as a result, more power to be provided to the lamp.

Whenever the light output is inadequate to cause the magnitude of the voltage across Ra to reach the threshold, base current ceases to be provided to Qa, and the magnitude of the voltage across Qa will reach its maximum level; which maximum level is principally determined by the magnitude of the voltage between the T− and the T+ terminals. In turn, this magnitude is determined by the voltage developing across the fluorescent lamp in combination with the voltage transformation ratio of transformer T.

The parameters of Zener diode Z2 and warning means WM are so chosen that power will be provided to warning means WM whenever the magnitude of the voltage across Qa reaches its maximum level; which means that a warning will be provided whenever the light output from fluorescent lamp FL fails to reach a certain level.

Although different types of devices may be used as warning means WM, it is herein anticipated that the warning means be simple liquid crystal device parallel-loaded with a leakage resistor.

Or, the warning means could simply be a light-emitting diode, in which case the Zener diode may be substituted with a resistor.

FIG. 4 shows a fluorescent lighting fixture wherein a ballast B, made in accordance with the ballast circuit of FIG. 3, is positioned and connected with the fixture's fluorescent lamp(s) in a substantially ordinary manner.

A calibrated means for adjusting the magnitude of resistor Ra is accessible from the outside of the ballast.

Light sensor LS and warning means WM are each provided as an entity at one end of a light weight electrical cord; which cord has a plug at its other end. This plug is adapted to be plugged into a receptacle in the ballast itself, thereby to be properly connected in circuit with the feedback loop.

The complete feedback loop is electrically isolated from the power line and the main ballast circuit; which therefore readily permits both LS and WM, as well as their receptacles, cords and plugs, to be made and installed in accordance with the specifications for Class-2 or Class-3 electrical circuits, as defined by the National Electrical Code.

Like LS and WM, Ra could just as well have been provided as a plug-in entity at the end of a light weight cord; and, like Ra, both LS and WM could just as well have been provided as rigidly integral parts of the ballast itself.

Light sensor LS is positioned in such a way as to be exposed to the ambient light within the fixture; warning means WM is placed in a location whereby it is readily visible from some suitable place external of the fixture; and ballast B is placed in such manner as to provide for Ra to be reasonably accessible for adjustment.

The main purpose of warning means WM is that of providing a visually discernible signal to the effect that it is time to change the lamp(s) in the fixture.

The main purpose of adjustable resistor Ra is that of permitting adjustment of the level of light to be provided from the fixture.

Additional Comments a) When a fluorescent lamp is initially provided with power, its light output will be substantially lower than it will be once the lamp has warmed up to proper operating temperature. Under most normal circumstances, the ballast of FIG. 3 provides compensation for this effect, in that the lamp will automatically be provided with substantially more power as long as the light output is not up to the desired level—even if the reason relates to the fact that the lamp has not reached proper operating temperature yet.

During this initial warm-up period, the warning means may indicate a need to replace the lamp. However, the warning signal should be disregarded, or at least interpreted with special care, during this initial lamp warm-up period.

b) In order for the feedback control loop to be considered as a Class-2 electrical circuit, it is convenient to limit the magnitude of the DC voltage provided between terminals T− and T+ to about 30 Volt. Also, the magnitude of the maximum current available therefrom should be limited to 8 Amp.

c) To provide for even more accuracy in the control feedback function, the magnitude of the voltage provided between the B and the B+ terminals could be regulated with a separate Zener diode. However, for most applications, the degree of voltage regulation provided by the fluorescent lamp should be adequate.

d) It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

I claim:

1. An arrangement comprising:

a lighting fixture including a gas discharge lamp having a pair of lamp terminals; the lamp having a luminous efficacy which may change over time; the lighting fixture being further characterized (i) by being of a type suitable for providing general illumination in a room, and (ii) by not including a light-emitting diode;

a ballast mounted in the lighting fixture; the ballast having a pair of power input terminals connected with the AC power line voltage of an ordinary electric utility power line, and a pair of output terminals connected with the lamp terminals; the ballast being operative to provide an alternating ballast output current from its output terminals, thereby to cause an alternating lamp current to flow through the gas discharge lamp; the alternating ballast output current having a fundamental frequency substantially higher than that of the AC power line voltage; the ballast being further characterized by: (i) not including a light-emitting diode; and (ii) including a control sub-circuit having a pair of control input terminals and being operative, in response to changes in a control signal provided thereto, to control the magnitude of the ballast output current; the control input terminals being electrically isolated from the ballast input terminals; and a light sensor disposed within the lighting fixture and arranged so as to be responsive to the light emitted from said gas discharge lamp, yet to be substantially non-responsive to light from any source external of the lighting fixture; the light sensor being connected with the control input terminals and operative to provide said control signal thereto in response to the intensity of the light emitted by the gas discharge lamp; the light sensor being further characterized by not including a light-emitting diode;

such that, for a given level of the lamp's luminous efficacy, if the magnitude of the AC power line voltage were to increase, the control signal would change in such manner as to cause the intensity of the light emitted from the gas discharge lamp to tend to be maintained at a substantially constant level.

2. The arrangement of claim 1 wherein the control sub-circuit is further characterized by not being responsive to rapidly alternating changes in the control signal, provided such rapidly alternating changes occur at a frequency equal to or higher than said fundamental frequency.

3. The arrangement of claim 1 wherein the gas discharge lamp is a fluorescent lamp.

4. The arrangement of claim 1 further characterized by being constructible without requiring the light emitted from the gas discharge lamp to vary synchronously with the fundamental frequency.

5. The arrangement of claim 1 further characterized by including a manually setable adjustment device (i) mounted on or at the lighting fixture, (ii) connected in circuit with the control input terminals, and (iii) functional to permit manual control of the amount of light emitted from the gas discharge lamp.

6. An arrangement comprising:
a lighting fixture including a gas discharge lamp having a pair of lamp terminals; the lamp having a luminous efficacy which may change over time; the lighting fixture being further characterized (i) by being of a type suitable for providing general illumination in a room, and (ii) by not including a light-emitting diode; and
a ballast disposed within the lighting fixture; the ballast having a pair of power input terminals connected with the AC power line voltage of an ordinary electric utility power line, and a pair of output terminals connected with the lamp terminals; the ballast being operative to provide an alternating ballast output current from its output terminals, thereby to cause an alternating lamp current to flow through the gas discharge lamp; the alternating ballast output current having a fundamental frequency substantially higher than that of the AC power line voltage; the ballast being further characterized by including (i) a control sub-circuit having a pair of control input terminals, the control input terminals being electrically isolated from the power input terminals, earth ground, and (ii) a manually setable adjustment device connected in circuit with the control input terminals and operative, by way of manual input to said manually setable adjustment device, to permit adjustment of the magnitude of the alternating ballast output current.

7. The arrangement of claim 6 further characterized by including a light sensor disposed within the lighting fixture and arranged so as to be responsive to the light emitted from said gas discharge lamp, yet to be substantially non-responsive to light from any source external of the lighting fixture; the light sensor being connected with the control input terminals and operative to provide said control signal thereto in response to the intensity of the light emitted by the gas discharge lamp.

8. An arrangement comprising:
a source operative to provide a power line voltage at a pair of power line conductors; and
a lighting fixture operative to provide luminous output suitable for general room illumination and otherwise characterized by:
(a) having power input terminals connected with the power line conductors;
(b) including a gas discharge lamp having lamp terminals;
(c) including a ballasting means connected between the power input terminals and the lamp terminals; the ballasting means having a pair of control input terminals that is electrically isolated from the power input terminals and being further characterized by: (i) supplying to the lamp terminals an alternating lamp current having a fundamental frequency substantially higher than that of the power line voltage; (ii) having sensing means responsive to light emitted from the gas discharge lamp, while being substantially non-responsive to light emitted from any source external of the lighting fixture, the sensing means being connected with the control input terminals; and (iii) causing the intensity of the light emitted from the gas discharge lamp to remain substantially constant irrespective of changes in the lamp's luminous efficacy; and
(d) not including a light-emitting diode.

9. An arrangement comprising:
a source operative to provide a power line voltage at a pair of power line conductors; and
a lighting fixture operative to provide luminous output suitable for general room illumination and otherwise characterized by:
(a) having power input terminals connected with the power line conductors;
(b) including a gas discharge lamp having lamp terminals;
(c) including a ballasting means connected between the power input terminals and the lamp terminals; the ballasting means having a pair of control input terminals that are electrically isolated from the power input terminals; the ballasting means being further characterized by: (i) supplying to the lamp terminals an alternating lamp current having a fundamental frequency substantially higher than that of the power line voltage; (ii) having sensing means responsive to light emitted from the gas discharge lamp, while being substantially non-responsive to light emitted from any source external of the lighting fixture; and (iii) causing the intensity of the light emitted from the gas discharge lamp to remain substantially constant irrespective of variations in the magnitude of the power line voltage; and
(d) not requiring the inclusion of a light-emitting diode.

10. An arrangement comprising:
a source operative to provide a power line voltage at a pair of power line conductors; and
a lighting fixture operative to provide luminous output suitable for general illumination in a room used for human occupancy and otherwise characterized by:
(a) having power input terminals connected with the power line conductors;
(b) including a gas discharge lamp having lamp terminals;
(c) including a ballasting means connected between the power input terminals and the lamp terminals; the ballasting means having a pair of control input terminals that are electrically isolated from the power input terminals; the ballasting means being further characterized by: (i) supplying to the lamp terminals an alternating lamp current having a fundamental frequency substantially higher than that of the power line voltage; (ii) having sensing means responsive to light emitted from the gas discharge lamp, while being substantially non-responsive to light emitted from any source external of the lighting fixture; (iii) causing the intensity of the light emitted from the gas discharge lamp to remain substantially constant irrespective of changes in the lamp's luminous efficacy; and
(d) not requiring the inclusion of a light source emitting light pulsating at a frequency many times higher than the frequency of the power line voltage.

* * * * *